US009691809B2

(12) United States Patent
Her et al.

(10) Patent No.: US 9,691,809 B2
(45) Date of Patent: Jun. 27, 2017

(54) BACKSIDE ILLUMINATED IMAGE SENSOR DEVICE HAVING AN OXIDE FILM AND METHOD OF FORMING AN OXIDE FILM OF A BACKSIDE ILLUMINATED IMAGE SENSOR DEVICE

(71) Applicant: Taiwan Semiconductor Manufacturing Company, Ltd., Hsin-Chu (TW)

(72) Inventors: Jeng Chang Her, Tainan (TW); Hung Jui Chang, Changhua County (TW); Li Te Hsu, Tainan (TW); Chung-Bin Tseng, Tainan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 330 days.

(21) Appl. No.: 13/931,500

(22) Filed: Jun. 28, 2013

(65) Prior Publication Data
US 2014/0263958 A1 Sep. 18, 2014

Related U.S. Application Data

(60) Provisional application No. 61/786,094, filed on Mar. 14, 2013.

(51) Int. Cl.
*H01L 27/146* (2006.01)

(52) U.S. Cl.
CPC .... *H01L 27/14685* (2013.01); *H01L 27/1462* (2013.01); *H01L 27/1463* (2013.01); *H01L 27/1464* (2013.01); *H01L 27/14636* (2013.01)

(58) Field of Classification Search
CPC .......... H01L 27/1463; H01L 27/14636; H01L 27/1464; H01L 27/14687; H01L 27/14632; H01L 27/14643; H01L 27/14683
(Continued)

(56) References Cited

U.S. PATENT DOCUMENTS 8,293,563 B2 * 10/2012 Hiyama ............ H01L 27/14623
257/E31.122
2002/0076843 A1 * 6/2002 Ruelke et al. .................. 438/29
(Continued)

FOREIGN PATENT DOCUMENTS

TW 200952166 A1 12/2009
TW 201205790 A1 2/2012

*Primary Examiner* — Que T Le
*Assistant Examiner* — Jennifer Bennett
(74) *Attorney, Agent, or Firm* — Haynes and Boone, LLP

(57) ABSTRACT

Disclosed is a method of fabricating an image sensor device, such as a BSI image sensor, and more particularly, a method of forming a dielectric film in a radiation-absorption region without using a conventional plasma etching causing roughness on the surface and non-uniformity within a die and a wafer. The method includes providing layers comprising a substrate having radiation sensors adjacent its front surface, an anti-reflective layer formed over the back surface of the substrate, a sacrificial dielectric layer formed over the anti-reflective layer, and a conductive layer formed over the sacrificial dielectric layer in a radiation-blocking region. The method further includes removing the sacrificial dielectric layer in the radiation-absorption region completely by a highly selective etching process and forming a dielectric film on the anti-reflective layer by deposition such as CVD or PVD while precisely controlling the thickness.

20 Claims, 4 Drawing Sheets

(58) Field of Classification Search
USPC ....... 257/294, 290, 291, 431, 436, 444, 443,
257/446, 447; 250/214 R, 214.1, 239,
250/208.1; 438/65, 66
See application file for complete search history.

(56) References Cited

U.S. PATENT DOCUMENTS

| | | | |
|---|---|---|---|
| 2006/0275944 A1* | 12/2006 | Hyun ................ | H01L 27/14621 438/70 |
| 2008/0169117 A1* | 7/2008 | Wang .................... | H01L 24/03 174/98 |
| 2009/0201395 A1* | 8/2009 | Manabe et al. ............... | 348/294 |
| 2009/0286346 A1* | 11/2009 | Adkisson .......... | H01L 27/14618 438/65 |
| 2010/0207226 A1* | 8/2010 | Park .................. | H01L 27/14623 257/432 |
| 2010/0244173 A1* | 9/2010 | Wang et al. .................. | 257/435 |
| 2011/0175187 A1* | 7/2011 | Ueno et al. ................... | 257/437 |
| 2011/0260221 A1* | 10/2011 | Mao .................... | H01L 27/1464 257/291 |
| 2013/0009270 A1* | 1/2013 | Tsai .................. | H01L 27/14623 257/459 |
| 2013/0299886 A1* | 11/2013 | Chuang ............. | H01L 27/14623 257/292 |
| 2014/0061842 A1* | 3/2014 | Ting .................. | H01L 27/14623 257/448 |

* cited by examiner

Within Die Unformity

Within Wafer Unformity

Damage

BACKSIDE ILLUMINATED IMAGE SENSOR DEVICE HAVING AN OXIDE FILM AND METHOD OF FORMING AN OXIDE FILM OF A BACKSIDE ILLUMINATED IMAGE SENSOR DEVICE

REFERENCE TO RELATED APPLICATIONS

This application claims the benefit of U.S. Provisional Application No. 61/786,094, filed on Mar. 14, 2013.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors that can absorb radiation projected toward the substrate and convert the sensed radiation into electrical signals. A back side illuminated (BSI) image sensor device is one type of image sensor devices. These BSI image sensor devices are operable to detect light from its backside.

The conventional sensor, called the front side illumination (FSI) image sensor for these CMOS chips, is constructed in a fashion similar to the human eye, and has a lens at the front, layers of metal having wiring in the middle, and photo detectors on a silicon substrate (which absorbs the light) at the back. These metal layers may not only deflect the light on the sensor, they could also reflect it, reducing the incoming light captured by the photo detectors. By contrast, the back side illuminated (BSI) sensor has the same elements as FSI, but orients the wiring behind the photo detectors layer by flipping the silicon wafer during manufacturing and then thinning its reverse side so that light will hit the silicon first, and the photo detectors layer without passing through the wiring layer. This change can improve the chance of an input photon being captured from about 60% to over 90%, and the sensitivity per unit area to deliver better low-light shots.

A BSI image sensor device typically has a radiation-absorption region or a radiation-absorption region, a periphery region, and a bonding pad region. The radiation-absorption region has a silicon substrate that includes an array or grid of pixels formed inside for sensing and recording an intensity of electromagnetic radiation or wave (such as light) entering the substrate from the backside, and some circuitry and input/outputs adjacent the grid of pixels for providing an operation environment for the pixels and for supporting external communication with the pixels. After the grid of pixels and the circuitry and input/outputs are formed within the substrate, the substrate is thinned from its backside to a desired thickness, the backside of the substrate in the radiation-absorption region is covered by one or more anti-reflective (AR) layers and a sacrificial dielectric layer or film. To enhance the absorption of radiation by the substrate, it is important to reduce the thickness of the sacrificial dielectric layer to an optimum value so that the resulting dielectric film may, together with the AR layers, effectively reduce the reflection of radiation at the surface of the substrate.

The conventional method in the current art uses a plasma etching process to remove part of the sacrificial dielectric and reduce it to a thin dielectric film of a desired thickness. The conventional method, however, has many problems. First, with the plasma etching process, it is very difficult to control the thickness of the film to obtain a desirable degree of uniformity and profile within the wafer or even within the die. Further, the capability of the etching process of obtaining uniformity in film thickness is also easily influenced by prior processes of forming the oxide layer that may have been impaired or deviated. Second, the plasma etching process will damage the dielectric film surface to cause a surface roughness problem.

Therefore, for enhancing the efficiency of radiation absorption and uniformity for higher quality and performance of a backside illuminated (BSI) image sensor device, it is desirable to provide a method of precisely controlling the oxide film thickness formed on the radiation-absorption region of the image sensor device, which the conventional etching process cannot do.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
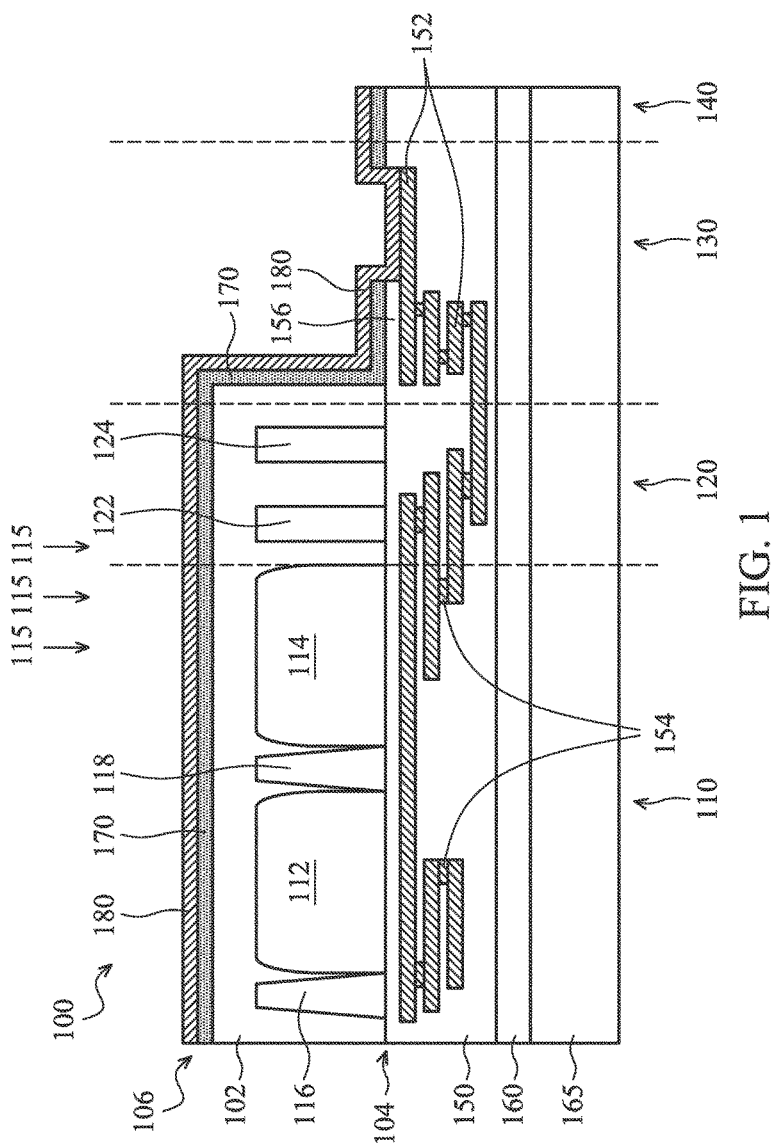
FIG. 1 is a schematic cross-sectional side view of a back side illuminated (BSI) image sensor device fabricated according to an aspect of the present disclosure.

FIG. 1 is a diagrammatic cross-sectional side view of a back side illuminated (BSI) image sensor device 100 fabricated according to an aspect of the present disclosure. The image sensor device 100 includes an array or grid of pixels for sensing and recording an intensity of electromagnetic radiation or wave (such as light) directed toward a back-side thereof. The image sensor device 100 may include a charge-coupled device (CCD), complimentary metal oxide semiconductor (CMOS) image sensor (CIS), an active-pixel sensor (APS), or a passive-pixel sensor. The image sensor device 100 further includes additional circuitry and input/outputs that are provided adjacent to the grid of pixels for providing an operation environment for the pixels and for supporting external communication with the pixels. It is understood that FIG. 1 has been simplified for a better understanding of the inventive concepts of the present disclosure and may not have been drawn to scale.

With reference to FIG. 1, the image sensor device 100 generally has a radiation-absorption region 110, a periphery region 120, a bonding pad region 130, and a scribe line region 140. The dashed lines in FIG. 1 designate the approximate boundaries between the regions 110, 120, 130, and 140. It is understood that these regions 110, 120, 130, and 140 extend vertically above and below the device substrate 102. The radiation-absorption region 110, to be described more in detail herein below, includes silicon substrate 102 that receives radiation and radiation-detection devices formed therein. The periphery region 120 may include other devices 122 and 124 that need to be kept optically dark. For example, the device 122 in an embodiment may be a digital device, such as an application-specific integrated circuit (ASIC) device or a system-on-chip (SOC) device. The other device 124 may be a reference pixel that is used to establish a baseline of an intensity of light for the image sensor device 100. The bonding pad region 130 may include one or more conductive bonding pads or E-pads, through which electrical connections between the image sensor device 100 and outside devices may be established. The scribe line region 140 may be the region that separates one semiconductor die that includes the bonding pad region 130, the periphery region 120, and the radiation-absorption region 110) from an adjacent semiconductor die (not illustrated). The scribe line region 140 is cut in a later fabrication process to separate adjacent dies before the dies are packaged and sold as integrated circuit chips. The scribe line region 140 is cut in such a way that the semiconductor devices in each die may not be damaged.

Still referring to FIG. 1, the radiation-absorption region 110 includes a device substrate 102. The device substrate 102 is a silicon substrate doped with a p-type dopant such as boron (for example a p-type substrate) or an n-type dopant such as phosphorous or arsenic (an n-type substrate). The substrate 102 may be comprised of a single semiconducting material such as bulk silicon or any other suitable elementary semiconducting materials, such as germanium in crystal; a compound semiconductor, such as silicon carbide, silicon germanium, gallium arsenic, gallium phosphide, indium phosphide, indium arsenide, and/or indium antimonide; or combinations thereof. The substrate 102 may also include an insulator layer on top of the semiconductor layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), thermal oxidation, deposition, and/or other suitable process. Alternatively, the substrate 102 may further include another semiconductor layer on top of an insulator layer to form a silicon-on-insulator (SOI) substrate, which can be fabricated using wafer bonding, and/or other suitable methods. The substrate 102 may comprise any suitable crystallographic orientation (e.g., a (100), (110), (111), or (001) crystallographic orientation).

The substrate 102 has a front side 104 and a back side 106. The typical thickness of the device substrate 102 may range between about 100 microns (um) and 3000 um. In the device substrate 102, radiation-absorption regions 110 may be formed, which includes radiation-detection devices, pixels 112 and 114. The pixels 112 and 114 are operable to sense radiation, such as an incident light 115, that is projected toward the back side 106 of the device substrate 102. Each of the pixels 112 and 114 may include a photodiode in one embodiment. In another embodiment, the pixels 112 and 114 may include pinned layer photodiodes, photogates, reset transistors, source follower transistors, and transfer transistors.

The pixels 112 and 114, though drawn schematically identically, may be varied from one another to have different junction depths, thicknesses, widths, and so forth. Also, only two pixels are illustrated in FIG. 1 for the sake of simplicity, but it is understood that any number of radiation-detection devices may be implemented in the device substrate 102. In one embodiment shown, the pixels 112 and 114 may be formed by performing a suitable implantation process on the device substrate 102 from the front side 104. The implantation process may include doping the device substrate 102 with a p-type dopant such as boron or an n-type dopant such as phosphorous or arsenic. In another embodiment, the pixels 112 and 114 may also be formed by a diffusion process.

Continuing to refer to FIG. 1, the radiation-absorption region 110 of the device substrate 102 may further include isolation structures, for example, isolation structures 116 and 118, which provide electrical and optical isolation between the pixels 112 and 114. The isolation structures 116 and 118 may include shallow trench isolation (STI) structures that are formed of a dielectric material such as silicon oxide or silicon nitride. The STI structures are formed by etching trenches or openings into the substrate 102 from the front side 104 and thereafter filling the openings with the dielectric material. In other embodiments, the isolation structures 116 and 118 may include doped isolation features, such as heavily doped n-type or p-type regions. It is understood that the isolation structures 116 and 118 are formed before the pixels 112 and 114. Again, only two isolation structures 116 and 118 are illustrated in FIG. 1 for the sake of simplicity, but it is understood that any number of isolation structures may be implemented in the device substrate 102 so that the radiation-absorption regions such as pixels 112 and 114 may be properly isolated.

Still referring to FIG. 1, the image sensor device 100 may further have an interconnect structure 150 formed over the front side 104 of the device substrate 102. The interconnect structure 150 may include a plurality of patterned dielectric layers and conductive layers that provide interconnections (e.g., wiring) between the various doped features, circuitry, and input/output of the image sensor device 100. The interconnect structure 100 may further include an interlayer dielectric (ILD) 156 and a multilayer interconnect (MLI) structure. The MLI structure includes contacts, vias and metal lines. For the purposes of illustration, a plurality of conductive metal lines 152 and vias/contacts 154 are shown in FIG. 1. It should be understood that the conductive lines 152 and vias/contacts 154 illustrated are merely exemplary, and the actual positioning and configuration of the conductive lines 152 and vias/contacts 154 may vary depending on design needs. The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts) and horizontal connection (for example, conductive lines). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 1, the image sensor device 100 may further include a buffer layer 160 formed on the interconnect structure 150. In the present embodiment, the buffer layer 160 includes a dielectric material such as silicon oxide. Alternatively, the buffer layer 160 may optionally include silicon nitride. The buffer layer 160 is formed by CVD, PVD, or other suitable techniques. The buffer layer 160 may be planarized to form a smooth surface by a chemical mechanical polishing (CMP) process.

Thereafter, a carrier substrate 165 may be further bonded with the device substrate 102 through the buffer layer 160, so that processing the back side 104 of the device substrate 102 can be performed. The carrier substrate 165 in the present embodiment is similar to the substrate 102 and includes a silicon material. Alternatively, the carrier substrate 165 may include a glass substrate or another suitable material. The carrier substrate 165 may be bonded to the device substrate 102 by molecular forces—a technique known as direct bonding or optical fusion bonding—or by other bonding techniques known in the art, such as metal diffusion or anodic bonding.

The buffer layer 160 provides electrical isolation between the device substrate 102 and the carrier substrate 165. The carrier substrate 165 provides protection for the various features formed on the front side 104 of the device substrate 102, such as the pixels 112 and 114. The carrier substrate 165 also provides mechanical strength and support for processing the back side 106 of the device substrate 102 as discussed below. After bonding, the device substrate 102 and the carrier substrate 165 may optionally be annealed to enhance bonding strength.

Still referring to FIG. 1, after finishing the CMOS processes on the front side of the substrate, the substrate 102 is flipped and a thinning process is performed from the backside 106 to thin the device substrate 102. The thinning process may include a mechanical grinding process and a chemical thinning process. A substantial amount of substrate material may be first removed from the device substrate 102 during the mechanical grinding process. Afterwards, the chemical thinning process may apply an etching chemical to the back side 106 of the device substrate 102 to further thin the device substrate 102 to a desired thickness. When the substrate 102 is a SOI type, the imbedded buried oxide layer (BOX) can act as an etching stop layer. Typically, the thickness of the substrate in a BSI image sensor is 5-10 μm. In an embodiment, the thickness may be less than 5 μm, even down to 2-3 μm. The thickness of the device substrate 102 may be implemented depending on the type of application and design requirements of the image sensor device 100.

After thinning the substrate 102 to a desired thickness, the substrate 102 in the bonding pad region 130 is removed by an etching process, starting from the back side 106 of the substrate 102, until an interlayer dielectric layer (ILD) 156 on the interconnect structure 100 is exposed to form a bonding pad structure thereon. FIG. 1 shows the bonding pad region 130 after the substrate 102 has been already removed.

Still referring to FIG. 1, a dielectric layer 170 is formed over the back side 106 of the device substrate 102 (or over the BOX layer if the substrate was of a SOI type) and over the exposed surface of the ILD layer 156 in the bonding pad region 130. Then, a portion of the dielectric layer 170 in the bonding pad region 130 is further etched to expose a portion of the top-most conductive line 152 in the interconnect structure 100, on which a bonding pad will be formed. Over the dielectric layer 170, one or more layers of backside anti-reflective (AR) (not shown) may be further formed in the radiation-absorption region 110. In an embodiment of the present disclosure, an additional dielectric layer (not shown), called, a sacrificial dielectric layer, is further formed over the AR layer.

Thereafter, a conductive layer 180 is formed over the sacrificial dielectric layer in the radiation-absorption region 110, and also over the exposed conductive line 152 in the bonding pad region 130. In an embodiment, the conductive layer 180 includes a metal or a metal alloy material, for example aluminum (Al) or an aluminum copper alloy (AlCu). The portion of the conductive layer 180 that comes into physical contact with the top-most conductive line 152 in the bonding pad region 130 will be patterned into a bonding pad later.

In the radiation-absorption region 110, an etching process is performed to remove the portion of the conductive layer 180 to the level of the sacrificial dielectric layer, so that radiation may enter the substrate 102 through the sacrificial dielectric layer, AR layer(s), the dielectric layer 170 to reach the pixels 112 and 114 without being obstructed by the conductive layer 180 (likely opaque). FIG. 1 shows the conductive layer 180 before the removal of the portion of the conductive layer 180 in the radiation-absorption region 110. The etching process also removes a portion of the conductive layer 180 in the bonding pad region 130 as well in a manner such that the remaining portion of the conductive layer 130 in the bonding pad region 130 forms a conductive bonding pad.

The sacrificial dielectric layer exposed in the radiation-absorption region 110 needs to be thinned to a key thickness to act as an optical film together with the AR layer(s) below such that the radiation entering the substrate 102 may suffer little reflection on the surface of the substrate and be absorbed by the substrate 102 in maximum. In that sense, the dielectric layer operates as one of the AR layers. The present disclosure is involved with a method, which will be described in detail herein below, for forming a dielectric film in the radiation-absorption region 110 while precisely controlling its thickness to obtain uniformity throughout a die as well as a wafer, and without damaging the surface of the dielectric layer as the conventional plasma etching process did.

Thereafter, though not illustrated in FIG. 1, an additional processing may be performed to complete the fabrication of the image sensor device 100. For example, a passivation layer may be formed around the image sensor device for protection (for example against dust or humidity). Color filters may be formed within the radiation-absorption region 110. The color filters may be positioned such that the incoming light is directed thereon and therethrough. The color filters may include a dye-based (or pigment based)

polymer or resin for filtering a specific wavelength band of the incoming light, which corresponds to a color spectrum (e.g., red, green, and blue). Thereafter, micro-lenses are formed over the color filters for directing and focusing the incoming light toward specific radiation-absorption regions in the device substrate 102, such as pixels 112 and 114. The micro-lenses may be positioned in various arrangements and have various shapes depending on a refractive index of material used for the micro-lens and distance from a sensor surface. It is also understood that the device substrate 102 may also undergo an optional laser annealing process before the forming of the color filters or the micro-lenses.

Figures 2A, 2B:
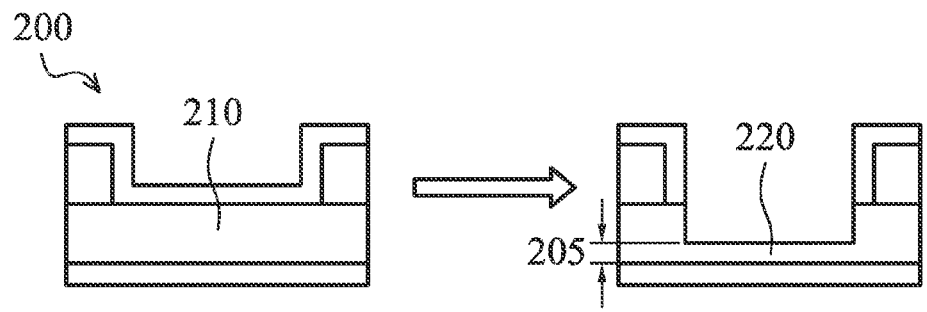
FIGS. 2A and 2B are schematic cross-sectional side views of top portions of a BSI image sensor device in the radiation-absorption region during fabrication according to an aspect of the present disclosure.

FIGS. 2A and 2B are schematic cross-sectional side views of a BSI image sensor device 200 in the radiation-absorption region, made in an aspect of the present disclosure. They show particularly, a sacrificial dielectric layer formed over the backside of the substrate. FIG. 2A shows the sacrificial dielectric layer 210 before it has been thinned to a key thickness 205, and FIG. 2B shows the sacrificial dielectric film 220 that resulted from the thinning process. Conventionally in the current art, the sacrificial dielectric layer 210 is partially removed by a plasma etching process until it reaches the desired key thickness to form the dielectric film 220. The plasma etching process, however, cannot avoid damaging the surface of the dielectric film 220, and cannot be precisely controlled to obtain uniform thickness of oxide film 220 across a wafer or even across a single die as previously noted.

Figure 2C:
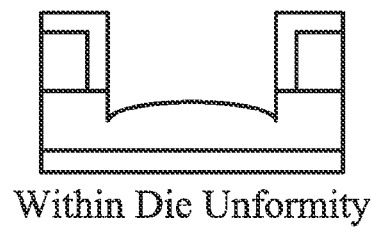
FIGS. 2C-2E illustrate the non-uniformity problems caused by using a conventional plasma etching process for formation of a dielectric film.
Figure 2D:
Figure 2E:
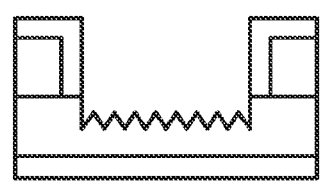

FIGS. 2C-2E illustrate the non-uniformity problems caused by using a plasma etching process for formation of a dielectric film. FIG. 2C illustrates the non-uniformity in thickness of the dielectric film within a die, FIG. 2D illustrates the non-uniformity in thickness of the dielectric film within a wafer, across multiple dies, and FIG. 2E illustrates the roughened surface of the dielectric film caused by the plasma etching process. To address those problems, the present disclosure provides a method of fabricating a BSI image sensor device, by which the dielectric film in the radiation-absorption region of the device is formed in a way of precisely controlling its thickness, without using a plasma etching process, so that all the afore-described non-uniformity problems are eliminated.

Figure 3:
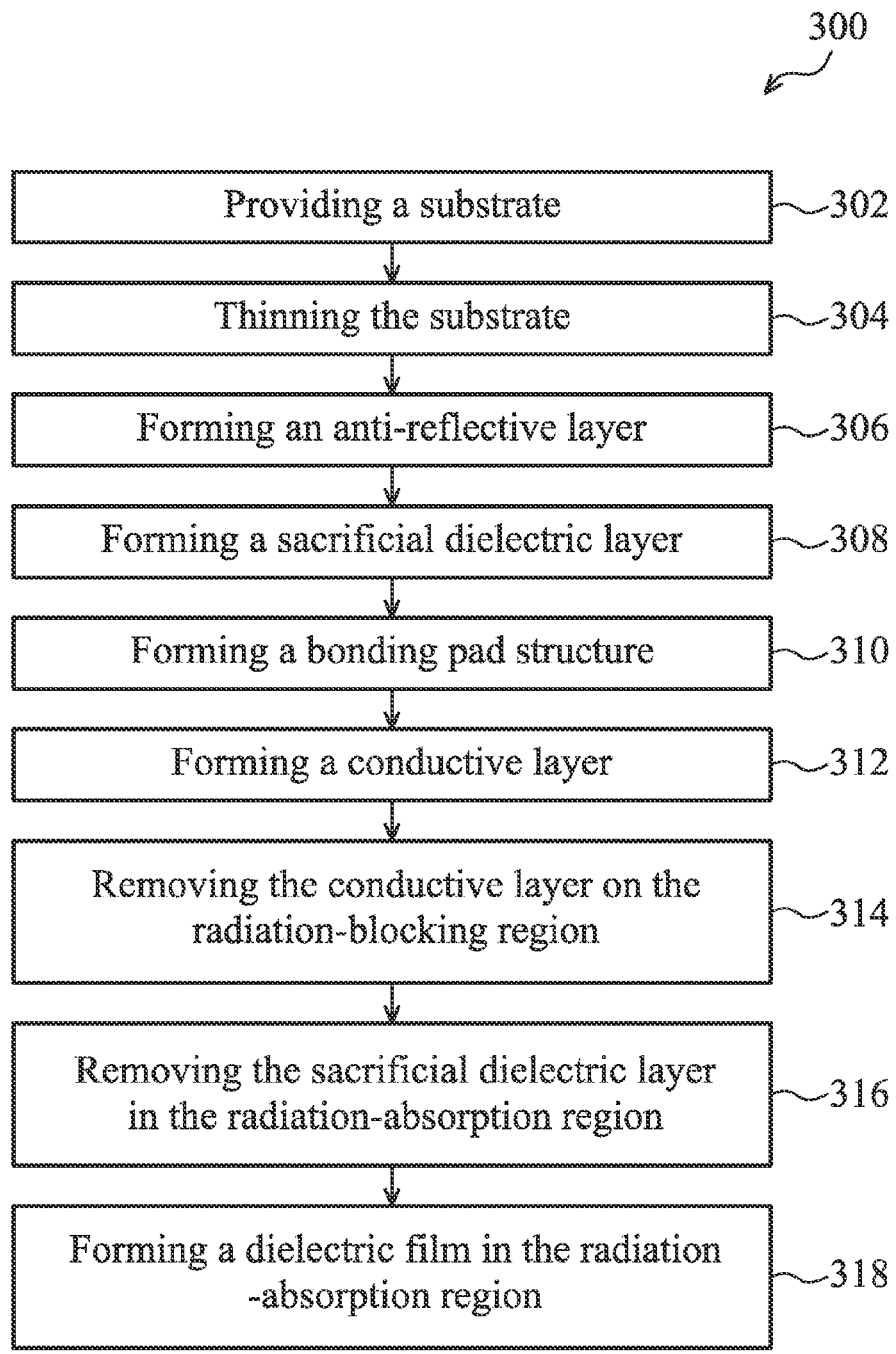
FIG. 3 is a flowchart of a method for fabricating a back-side illuminated (BSI) image sensor, more particularly, for forming an dielectric film in a radiation-absorption region, according to an aspect of the present disclosure.
Figure 4A:
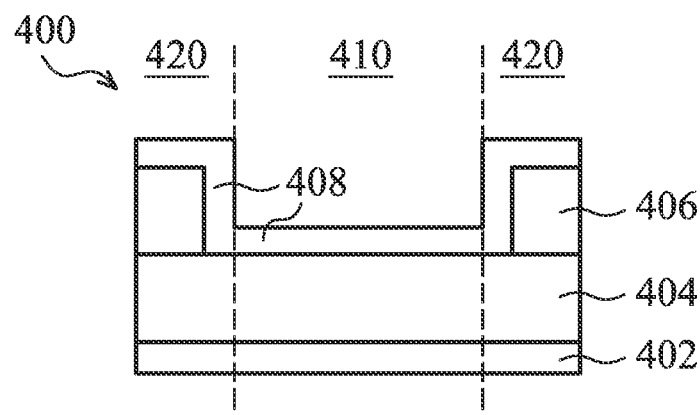
FIGS. 4A-4C schematically show partial steps of the method in FIG. 3 according to an aspect of the present disclosure.
Figure 4B:
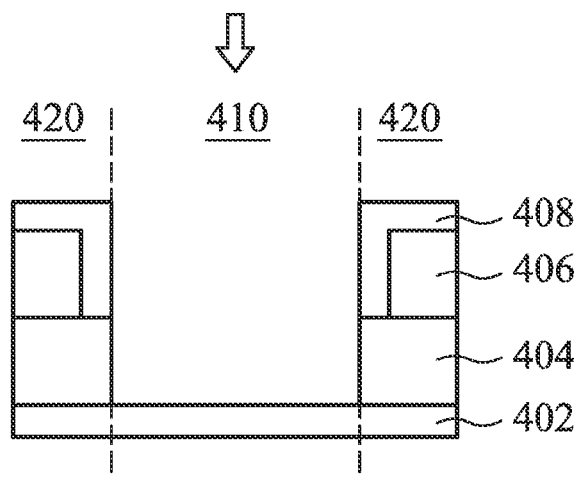
Figure 4C:
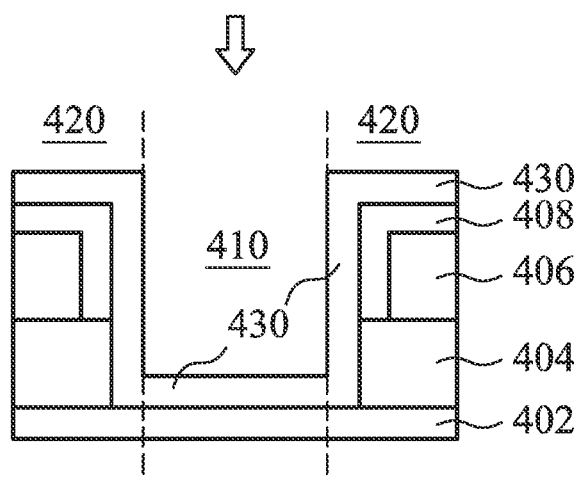

FIG. 3 is a flowchart of a method 300 for fabricating an image sensor device, such as a back-side illuminated (BSI) image sensor, according to an aspect of the present disclosure. In describing method 300 herein, FIGS. 4A-4C are referred to together, which illustrate schematically partial steps performed in the method 300 in an aspect of the present disclosure. The image sensor device, for which the method 300 is practiced, comprises a radiation-absorption region, a radiation-blocking region, and a bonding pad region. The radiation-absorption region is where the image sensor device receives radiation or electromagnetic wave into the device. In describing in FIG. 1, it was referred to as the radiation-absorption region because the silicon substrate in that region that receives radiation has radiation-detection devices formed therein. The radiation-blocking region was referred to as a periphery region of the device in the description of FIG. 1 and it may include other devices that need to be kept optically dark. In the bonding pad region, a bonding pad structure is constructed.

In the first step of the method 300, the step 302, a substrate is provided. Herein, the word 'provide' is used in a broad sense to encompass all modes of procuring the substrate, including, but not limited to, 'purchasing', 'preparing', 'manufacturing', 'arranging,' or 'making in order' the object, which is the substrate. The substrate extends across the radiation-absorption and radiation-blocking regions and has a front side and a back side. The substrate may be comprised of a single semiconducting material such as bulk silicon or any other suitable elementary semiconducting materials, such as germanium in crystal; a compound semiconductor, such as silicon carbide, silicon germanium, gallium arsenic, gallium phosphide, indium phosphide, indium arsenide, and/or indium antimonide; or combinations thereof, and may be doped with a p-type dopant such as boron (for example a p-type substrate) or an n-type dopant such as phosphorous or arsenic (an n-type substrate). The substrate may also include an insulator layer on top of the semiconductor layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), oxidation, deposition, and/or other suitable process. Alternatively, the substrate may further include another semiconductor layer on top of an insulator layer to form a silicon-on-insulator (SOI) substrate, which can be fabricated using wafer bonding, and/or other suitable methods. The substrate may comprise any suitable crystallographic orientation (e.g., a (100), (110), (111), or (001) crystallographic orientation). Typically, the thickness of the substrate may range between about 100 microns (um) and 3000 um.

In the radiation-absorption region, the substrate has a plurality of radiation sensors, called pixels, formed adjacent its front surface through CMOS processes. Each of the radiation sensors is operable to sense radiation entering the substrate through its back surface and may include a photodiode in one embodiment. In another embodiment, the radiation sensors may include pinned layer photodiodes, photogates, reset transistors, source follower transistors, and transfer transistors. In one embodiment, the radiation sensors may be formed by performing a suitable implantation process on the substrate from the front side. The implantation process may include doping the substrate with a p-type dopant such as boron or an n-type dopant such as phosphorous or arsenic. In another embodiment, the radiation sensors may also be formed by a diffusion process.

The substrate may further include isolation structures, which provide electrical and optical isolation between the radiation sensors. The isolation structures may include shallow trench isolation (STI) structures that are formed of a dielectric material such as silicon oxide or silicon nitride. The STI structures are formed by etching trenches or openings into the substrate from the front side and thereafter filling the openings with the dielectric material. In other embodiments, the isolation structures may include doped isolation features, such as heavily doped n-type or p-type regions. The isolation structures may be formed before the radiation sensors in an embodiment.

After providing the substrate, then at step 304, the substrate is thinned from the back surface to a suitable value of predetermined thickness. The thinning process may include a mechanical grinding process and a chemical thinning process. A substantial amount of substrate material may be first removed from the device substrate during the mechanical grinding process. Afterwards, the chemical thinning process may apply an etching chemical to the back side of the substrate to further thin the substrate to a desired thickness. When the substrate is a SOI type, the imbedded buried oxide layer (BOX) can act as an etching stop layer. Typically, the thickness of the substrate in a BSI image sensor is 5-10 μm. In an embodiment, the thickness may be less than 5 μm, even down to 2-3 μm. The thickness of the substrate may be implemented depending on the type of application and design requirements of the image sensor device.

After thinning the substrate, a dielectric layer may be formed over the back surface of the substrate (or over the BOX layer if the substrate was of a SOI type). The dielectric layer may include a dielectric material such as silicon oxide. Alternatively, the dielectric layer may optionally include silicon nitride. The dielectric layer may be formed by CVD, PVD, thermal oxidization, spin-on coating, spin-on dielectric (SOD) process, or other suitable techniques. The dielectric layer may be planarized to form a smooth surface by a chemical mechanical polishing (CMP) process. The dielectric layer provides electrical isolation for the substrate.

Still referring to FIG. 3, at step 306, a backside anti-reflective (AR) layer may be formed on the back surface of the substrate to increase the absorption of the incoming radiation to the substrate, and thereby enhance the efficiency of the image sensor device. The reduction in reflections also improves the contrast of the image by elimination of stray light and reduces image distortions associated with reflections at the surface of the substrate. The AR layer may comprise transparent thin film structures with alternating layers of dielectric materials of contrasting refractive index. It may be any of the three families, the G-line, I-line, or DUV, commonly used for BSI image sensor device. In one embodiment, the layers of silicon nitride and silicon oxide (SiN/SiO) may be used. In another embodiment, a layer of silicon carbide (SiC) may be used. But the AR layer may comprise any other suitable material known in the art. The AR layer may be formed by CVD, PVD, thermal oxidization or other suitable techniques. The individual layer thicknesses are chosen to produce destructive interference in the beams reflected from the interfaces, and constructive interference in the corresponding transmitted beams so that the absorption of incident radiation may be maximized at surface of the substrate. The AR layer may be made of either inorganic material, which can be deposited on the substrate in a special deposition chamber, or organic material, which can be applied like a photoresist without having to use the expensive deposition chamber.

Continuing to refer to FIG. 3, at step 308, a sacrificial dielectric layer is formed on the AR layer in the radiation-absorption region. In the later fabrication process, the sacrificial dielectric layer is thinned to a key thickness to form a dielectric film. The dielectric material used for the sacrificial dielectric layer may be the typical undoped and doped silicon dioxide ($SiO_2$), silicon oxynitride (SiON), silicon nitride ($Si_3N_4$), high-density plasma (HDP) oxides, TEOS oxides, high-k dielectric material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, or any other suitable materials, or combinations thereof. In some embodiments, the sacrificial dielectric layer may have a multi-layer structure such as a thermal oxide liner layer filled with silicon nitride or silicon oxide. The sacrificial dielectric layer may be formed by CVD, PVD, thermal oxidization, spin-on coating, spin-on dielectric (SOD) process, or other suitable techniques. The sacrificial dielectric may be planarized to form a smooth surface by a chemical mechanical polishing (CMP) process.

After thinning the substrate to a desired thickness, at step 310, a bonding pad structure is formed in the bonding pad region. For that, part of the substrate in the bonding pad region is further removed by an etching process, starting from the back side of the substrate, until an interlayer dielectric layer (ILD), such as the element 156 in FIG. 1, on the interconnect structure is exposed. FIG. 1 shows the bonding pad region after the substrate has been already removed by a proper etching process. In an embodiment, a dielectric layer, such as the element 170 in FIG. 1, may be formed over the back side of the device substrate, and also over the exposed surface of the ILD layer in the bonding pad region. Thereafter, a portion of the bonding pad region is etched to expose a portion of the top-most conductive line in the interconnect structure. A bonding pad will be formed on the exposed conductive line. Then, a bonding pad conductive layer is formed over the dielectric layer from the back side and over the conductive line in the bonding pad region by depositing conducting materials such as AlCu via a suitable deposition process. A portion of the conductive layer may come into physical contact with the top-most conductive line in the interconnect structure through vias. This portion of the conductive layer will be patterned into a bonding pad. More detailed description of forming a bonding pad structure is known in the art, and thus, not described herein further.

Still referring to FIG. 3, now at step 312, a conductive layer, or a radiation-blocking layer, is formed on the sacrificial dielectric layer in the radiation-blocking region of the image sensor device. For that, a conductive material is deposited over the sacrificial dielectric layer that extends both in the radiation-absorption region and radiation-blocking region. In an embodiment, the conductive material may be a metal or a metal alloy material, for example, copper (Cu), aluminum (Al) or an aluminum copper alloy (AlCu). The conductive layer may be formed by a process including physical vapor deposition (PVD) (or sputtering), chemical vapor deposition (CVD), atomic layer deposition (ALD), plating, or combinations thereof, or other suitable processes. This conductive layer in the radiation-absorption region and radiation-blocking region may be formed together with, or separately from the bonding pad conductive layer formed in the bonding pad region, depending on different embodiments. The conducting materials for the layers also may be equal or different from each other, again depending on different embodiments.

After forming the conductive layer over the sacrificial dielectric layer across the radiation-absorption region and radiation-blocking region, then at step 314, the portion of the conductive layer (likely opaque) in the radiation-absorption region is removed by a suitable etching process to let radiation enter the substrate in the radiation-absorption region. Without the obstructing conductive layer, the radiation passes through the sacrificial dielectric layer and AR layer(s) and enters the substrate to be detected by the radiation sensors within the substrate. The removal of the portion of the conductive layer in the radiation-absorption region may be performed by the conventional photolithography patterning processes that may include photoresist coating (e.g., spin-on coating), soft baking, mask aligning, exposure, post-exposure baking, developing the photoresist, etching, rinsing, drying (e.g., hard baking), other suitable processes, and/or combinations thereof. Alternatively, the photolithography exposing process may be implemented or replaced by other proper methods such as mask-less photolithography, electron-beam writing, and ion-beam writing. When etching the conductive layer, any known etching processes may be used, such as wet etching, dry etching, or plasma etching, but when an anisotropic etching is desired, a plasma etching may be used with etchants such as $CH_2F_2$, $CH_4$, $Cl_2$, $CCl_4$, $SiCl_2$, $BCl_3$, $CCl_2F_2$, $CF_4$, $SF_6$, or $NF_3$.

After removal of the portion of the conductive layer in the radiation-absorption region, the conductive layer remains only in the radiation-blocking region. The radiation-blocking region, or the periphery region 120 in FIG. 1, may include, within the substrate in that region, other devices that need to be kept optically dark. These devices may be in one embodiment a digital device, such as an application-specific integrated circuit (ASIC) device or a system-on-chip (SOC) device, or in another embodiment a reference pixel that is used to establish a baseline of an intensity of light for the image sensor device. Optionally, in an embodiment, another dielectric layer may be further formed over the conductive layer formed in the radiation-blocking region and over the sacrificial dielectric layer in the radiation-absorption region. The dielectric layer may be deposited by similar processes as with the sacrificial dielectric layer and may comprise, in one embodiment, same dielectric material with the sacrificial dielectric layer. But in another material, it could use different dielectric material.

Now, FIG. 4A-4C schematically show cross-sectional side views of a top portion of an image sensor device 400 while partial steps of the method 300 in an aspect of the present disclosure are being performed. FIG. 4A shows such a top portion of an image sensor device 400 when the step 314 has been finished. The layer 402 represents multiple layers comprising a substrate including radiation sensors, a dielectric layer and one or more anti-reflective layers over the substrate. The layer 404 represents a sacrificial dielectric layer deposited at step 310. Both the layer 402 and the sacrificial dielectric layer 404 extend across both the radiation-absorption region 410 and the radiation-blocking region 420. The structures 406 in the radiation-blocking region 420 represent remaining portions of a conductive layer, which was initially deposited in both regions of 410 and 420, and thereafter partially removed in the radiation-absorption region 410 to have the sacrificial dielectric layer 404 exposed at step 314. The layer 408 is an additional dielectric layer deposited after the formation of the conductive layer 406 in the radiation-blocking region 420.

Continuing to refer to FIG. 3, now at step 316, the sacrificial dielectric layer in the radiation-absorption region is completely removed to the level of the layer 402 below by a highly selective etching process. Any known etching processes may be used, such as wet etching, dry etching (plasma etching), chemical or physical etching or combinations thereof, but when an anisotropic etching is desired, a plasma etching may be used. The etchants that may be used may include, but are not limited to, wet etchants such as potassium hydroxide (KOH), ethylene diamine and pyrocatechol (EDP), or Tetramethylammonium hydroxide (TMAH), or plasma etchants such as $CH_2F_2$, $CH_4$, $Cl_2$, $CCl_4$, $SiCl_2$, $BCl_3$, $CCl_2F_2$, $CF_4$, $SF_6$, or $NF_3$. FIG. 4B shows the top portion of an image sensor device 400 after the sacrificial dielectric layer 404 in FIG. 4A has been completely removed by a suitable but highly selective etching process at step 316.

Lastly, at step 318, a dielectric film on the anti-reflective layer is formed in the radiation-absorption region 410 by re-depositing dielectric material on the exposed layer 402. The dielectric film may be formed by any suitable known method in the art, including but not limited to, chemical vapor deposition (CVD), physical vapor deposition (PVD), atomic layer deposition (ALD), molecular beam epitaxy (MBE), high density plasma CVD (HDPCVD), metal organic CVD (MOCVD), remote plasma CVD (RPCVD), Electro-less deposition, plating, thermal oxidization, or and/or combinations thereof. Such an epitaxy process may use either gaseous and/or liquid precursors. In an embodiment, the dielectric film may be formed by a plasma-enhanced chemical vapor deposition (PECVD), a process used to deposit thin films from a gas state (vapor) to a solid state on a substrate. After deposition, the oxide film may be planarized to form a smooth surface by a chemical mechanical polishing (CMP) process. The dielectric material for the film may be the same material used for the sacrificial dielectric layer removed at step 316 in one embodiment, or a different dielectric material in another embodiment. FIG. 4C shows the top portion of an image sensor device 400 after the dielectric film 430 has been formed in the radiation-absorption region 410 with a key thickness by a suitable deposition process at step 318.

While depositing the oxide material, the thickness of the dielectric film 430 is carefully and precisely controlled to ensure that the oxide film has a precise key thickness so that in combination with the anti-reflective layer(s) of respective thicknesses and refractive indices below the film, the dielectric film 430 may cause a destructive interference between reflected beams to reduce or eliminate the reflection at the back surface of the substrate, and thereby maximize absorption of the incident radiation. In an embodiment the thickness of the dielectric film 430 may range between 5 and 100 nanometers (nm). The exact thickness of the dielectric film 430 may be implemented depending on the refractive index of the dielectric film 430 itself, the thicknesses and refractive indexes of the underlying anti-reflective layer(s), the type of application, or other design requirements of the image sensor device.

With this method of the present disclosure, the thickness of a dielectric film can be precisely controlled during deposition by using a film deposition techniques to achieve good uniformity of thickness and quality control, and the problem of rough dielectric film surface and non-uniformity of the film within a die or within a wafer caused by use of a conventional plasma etching process is completely eliminated. Further, the full removal of the sacrificial dielectric layer and re-deposition of a new dielectric film nullifies potential previous issues that may have affected the quality of the oxide layer, and thus, ensures more process flexibility. Moreover, by the process of re-depositing a new dielectric film, which allows selecting a new material for the oxide film, the method of the present disclosure overcomes the limitation in the choice of the optical film material for the conventional method of using a plasma etching process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method of fabricating an image sensor device, comprising:
providing a substrate having a radiation-absorption region, a radiation-blocking region, and a bonding pad region, wherein the substrate in the radiation-absorption region has a plurality of radiation sensors adjacent a front surface thereof, each of the sensors being operable to sense radiation projected through a back surface of the substrate;

thinning the substrate from the back surface to a predetermined thickness;

forming an anti-reflective layer over the back surface of the substrate;

forming a sacrificial dielectric layer on the anti-reflective layer in the radiation-absorption region;

forming a conductive layer over the sacrificial dielectric layer;

removing at least a portion of the conductive layer in the radiation-absorption region to expose a portion of the sacrificial layer;

after removing the at least a portion of the conductive layer, removing the portion of the sacrificial dielectric layer to expose a portion of the anti-reflective layer; and forming a dielectric film on the portion of the anti-reflective layer and on a sidewall of the sacrificial dielectric layer by deposition, the dielectric film in physical contact with the anti-reflective layer.

2. The method of claim 1, wherein the image sensor device is a backside illuminated (BSI) image sensor.

3. The method of claim 1, further comprising forming an interconnect structure over the front surface of the substrate.

4. The method of claim 1, further comprising forming a bonding pad structure in the bonding pad region.

5. The method of claim 1, wherein the thinning the substrate from the back surface utilizes a chemical mechanical planarization (CMP) process.

6. The method of claim 1, wherein the forming the anti-reflective layer includes forming at least two consecutive dielectric material layers having different refractive indexes.

7. The method of claim 1, wherein the removing the sacrificial dielectric layer includes a selective etching process.

8. The method of claim 1, wherein the forming the dielectric film includes controlling the thickness of the dielectric film during deposition.

9. The method of claim 8, wherein the thickness of the dielectric film is controlled to range between 5 and 100 nanometers.

10. The method of claim 8, wherein the thickness of the dielectric film is controlled to cause, in combination with the underlying anti-reflective layer, a destructive interference of incoming radiation at the back surface of the substrate.

11. The method of claim 1, wherein the deposition in the forming the dielectric film utilizes a process selected from a chemical vapor deposition (CVD), a physical vapor deposition (PVD), an atomic layer deposition (ALD), or a thermal oxidization.

12. A method of forming an image sensor device, comprising:

providing stacked layers comprising: a substrate having a plurality of radiation sensors formed adjacent a front surface thereof in a radiation-absorption region; an anti-reflective layer formed over a back surface of the substrate; a sacrificial dielectric layer formed over the anti-reflective layer; and a conductive layer formed over the sacrificial dielectric layer in a radiation-blocking region of the image sensor device;

removing at least a portion of the conductive layer to expose a portion of the sacrificial dielectric layer;

after removing the at least a portion of the conductive layer, removing the portion of the sacrificial dielectric layer in the radiation-absorption region to expose a portion of the anti-reflective layer; and forming a dielectric film over and in contact with the portion of the anti-reflective layer by deposition.

13. The method of claim 12, wherein the image sensor device is a back side illuminated (BSI) image sensor.

14. The method of claim 12, wherein the removing the sacrificial dielectric layer includes a selective etching process.

15. The method of claim 12, wherein the forming the dielectric film includes controlling the thickness of the dielectric film during deposition.

16. The method of claim 15, wherein the thickness of the dielectric film is controlled to range between 5 and 100 nanometers.

17. The method of claim 15, wherein the thickness of the dielectric film is controlled to cause, in combination with the underlying anti-reflective coating layer, a destructive interference of incoming radiation at the back surface of the substrate.

18. The method of claim 12, wherein the deposition in the forming the dielectric film utilizes a process selected from: a chemical vapor deposition (CVD), a physical vapor deposition (PVD), an atomic layer deposition (ALD), or a thermal oxidization.

19. A back side illuminated (BSI) image sensor device having a radiation-absorption region, a radiation-blocking region, and a bonding pad region, the device comprising:

a substrate having a plurality of radiation sensors formed adjacent a front surface thereof in the radiation-absorption region;

an anti-reflective layer formed over a back surface of the substrate;

a sacrificial dielectric layer formed over the anti-reflective layer in the radiation-blocking region;

a conductive layer formed over and in contact with the sacrificial dielectric layer in the radiation-blocking region;

an additional dielectric layer formed over the conductive layer and adjacent to the sacrificial dielectric layer in the radiation-blocking region;

a dielectric film formed over the additional dielectric layer, the conductive layer, and the sacrificial layer in the radiation-blocking region, wherein the dielectric film is additionally disposed along a sidewall of the additional dielectric layer and a sidewall of the sacrificial layer in the radiation-blocking region such that the dielectric film physically contacts the sidewall of the additional dielectric layer and the sidewall of the sacrificial layer, wherein the dielectric film physically contacts the anti-reflective layer in the radiation blocking region;

a bottom dielectric layer formed over an opening portion of an interlayer dielectric (ILD) layer by thinning and removing the back surface of the substrate to expose the ILD layer in the bonding pad region; and a bonding pad formed above the bottom dielectric layer in the bonding pad region.

20. The BCI image sensor device of claim 19, wherein the additional dielectric physically contacts the sacrificial dielectric layer in the radiation-blocking region.

* * * * *